(12) United States Patent
Sui et al.

(10) Patent No.: US 11,856,831 B2
(45) Date of Patent: Dec. 26, 2023

(54) COLOR FILTER SUBSTRATE AND METHOD FOR MANUFACTURING THE SAME, DISPLAY DEVICE

(71) Applicant: BOE TECHNOLOGY GROUP CO., LTD., Beijing (CN)

(72) Inventors: Kai Sui, Beijing (CN); Xiaolei Zhang, Beijing (CN); Zhongyuan Sun, Beijing (CN); Yuan Jia, Beijing (CN); Dapeng Xue, Beijing (CN); Lubin Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 314 days.

(21) Appl. No.: 17/214,176

(22) Filed: Mar. 26, 2021

(65) Prior Publication Data
US 2022/0020822 A1   Jan. 20, 2022

(30) Foreign Application Priority Data

Jul. 16, 2020  (CN) .......................... 202010687079.5

(51) Int. Cl.
  *H10K 59/38*   (2023.01)
  *H10K 50/115*   (2023.01)
  *H10K 50/86*   (2023.01)
  *H10K 71/00*   (2023.01)

(52) U.S. Cl.
  CPC ........... *H10K 59/38* (2023.02); *H10K 50/115* (2023.02); *H10K 50/865* (2023.02); *H10K 71/00* (2023.02)

(58) Field of Classification Search
  None
  See application file for complete search history.

(56) References Cited

U.S. PATENT DOCUMENTS

| | | | |
|---|---|---|---|
| 2019/0018286 A1* | 1/2019 | Kim | G02F 1/133504 |
| 2019/0137815 A1* | 5/2019 | Kim | G02F 1/133514 |
| 2020/0388654 A1* | 12/2020 | Lee | H10K 59/38 |

(Continued)

FOREIGN PATENT DOCUMENTS

| | | |
|---|---|---|
| CN | 106647002 A | 5/2017 |
| CN | 107861181 A | 3/2018 |

(Continued)

OTHER PUBLICATIONS

China Patent Office, CN202010687079.5 First Office Action dated Aug. 27, 2021.

*Primary Examiner* — Michael Lebentritt
(74) *Attorney, Agent, or Firm* — HOUTTEMAN LAW LLC

(57) ABSTRACT

The present disclosure provides a color filter substrate and a method for manufacturing the same, and a display device, and the color filter substrate includes a base substrate, a black matrix and a color filter layer located on the base substrate, a quantum dot layer located on a side of the color filter layer away from the base substrate, a barrier layer located on a side of the black matrix away from the base substrate, and a first inorganic layer, and the first inorganic layer at least includes: a first portion located between the color filter layer and the quantum dot layer; a second portion located on the base substrate and between the quantum dot layer and the barrier layer; and a third portion located on a side of the barrier layer away from the base substrate.

15 Claims, 4 Drawing Sheets

(56) References Cited

U.S. PATENT DOCUMENTS

2021/0066669 A1\* 3/2021 Kubota .............. H10K 50/8426
2021/0336172 A1\* 10/2021 Song ...................... H10K 59/38

FOREIGN PATENT DOCUMENTS

| CN | 109256484 | A | | 1/2019 | | |
|----|-----------|---|---|--------|---|---|
| CN | 109375411 | A | | 2/2019 | | |
| CN | 109633965 | A | | 4/2019 | | |
| CN | 111105721 | A | | 5/2020 | | |
| CN | 114122066 | A | \* | 3/2022 | .......... | G06K 9/0004 |
| JP | 2016157116 | A | | 9/2016 | | |
| JP | 2017187549 | A | \* | 10/2017 | | |

\* cited by examiner

ND METHOD
COLOR FILTER SUBSTRATE AND METHOD FOR MANUFACTURING THE SAME, DISPLAY DEVICE

CROSS-REFERENCE TO RELATED APPLICATIONS

The present application claims the priority of Chinese Patent Application No. 202010687079.5, filed on Jul. 16, 2020, the contents of which are incorporated herein in their entirety by reference.

TECHNICAL FIELD

The present disclosure relates to the technical field of display devices, and in particular to a color filter substrate, a manufacturing method of a color filter substrate and a display device.

BACKGROUND

Currently, quantum dot-organic light emitting diode (QD-OLED) technology is a relatively advanced way to realize high color rendering, and usually use a blue OLED as an excitation light source to excite a quantum dot (QD) material to emit light. The luminescence principle of QD is similar to that of conventional semiconductors, and is that carriers in the material reach an excited state after receiving external energy, and in the process of the carriers returning to the ground state, the energy is released by usually emitting light. Different QD materials can emit light within different wave bands after being excited by an external excitation light source. Red and green materials can emit red light and green light respectively after being excited by a blue light source.

SUMMARY

In a first aspect, an embodiment of the present disclosure provides a color filter substrate, including a base substrate, a black matrix and a color filter layer on the base substrate, a quantum dot layer on a side of the color filter layer away from the base substrate, and a barrier layer on a side of the black matrix away from the base substrate, where the black matrix defines a position of the color filter layer, and the barrier layer defines a position of the quantum dot layer, the color filter substrate further includes a first inorganic layer, and the first inorganic layer at least includes:
  a first portion located between the color filter layer and the quantum dot layer;
  a second portion located between the quantum dot layer and the barrier layer; and
  a third portion on a side of the barrier layer away from the base substrate.

In some implementations, the color filter substrate further includes a second inorganic layer, and the second inorganic layer includes:
  a fourth portion located on a side of the color filter layer proximal to the base substrate;
  a fifth portion located between the color filter layer and the black matrix;
  a sixth portion located between the black matrix and the barrier layer.

In some implementations, the color filter substrate further includes a plurality of pillar supports, and the pillar supports are spaced apart from each other and located on a side of the barrier layer away from the base substrate.

In some implementations, a cross section of the pillar support in a direction perpendicular to the base substrate is a trapezoid, a short base of the trapezoid being closer to the barrier layer than a long base of the trapezoid;
  the color filter substrate further includes a metal reflective layer, and the metal reflective layer is located on an outer surface of the pillar support and configured to reflect light incident from a light incident side to the quantum dot layer.

In some implementations, the color filter substrate further includes a third inorganic layer, and the third inorganic layer is located between the barrier layer and the pillar support, covers the quantum dot layer, and is configured to protect the quantum dot layer.

In some implementations, a thickness of each of the first inorganic layer, the second inorganic layer, and the third inorganic layer ranges from about 100 nm to about 1500 nm, and the thickness of the first inorganic layer is greater than the thickness of the second inorganic layer, which is greater than the thickness of the third inorganic layer.

In some implementations, a material of each of the first inorganic layer, the second inorganic layer, and the third inorganic layer includes one or more of silicon nitride, silicon dioxide, silicon oxynitride and aluminum oxide.

In some implementations, a refractive index of the material of the third inorganic layer is greater than a refractive index of the material of the first inorganic layer, which is greater than a refractive index of the material of the second inorganic layer.

In some implementations, the color filter substrate further includes a fourth inorganic layer, and the fourth inorganic layer is located between the pillar support and the metal reflective layer and is configured to protect the pillar support.

In some implementations, a thickness of each of the first inorganic layer, the second inorganic layer, and the fourth inorganic layer ranges from about 100 nm to about 1500 nm, and the thickness of the first inorganic layer is greater than the thickness of the second inorganic layer, which is greater than the thickness of the fourth inorganic layer.

In some implementations, a material of each of the first inorganic layer, the second inorganic layer, and the fourth inorganic layer includes one or more of silicon nitride, silicon dioxide, silicon oxynitride and aluminum oxide.

In some implementations, a refractive index of the material of the fourth inorganic layer is greater than a refractive index of the material of the first inorganic layer, which is greater than a refractive index of the material of the second inorganic layer.

In some implementations, a material of the metal reflective layer includes aluminum or silver, and a thickness of the metal reflective layer ranges from about 50 nm to about 8000 nm.

In some implementations, the metal reflective layer does not cover a surface of the pillar support away from the base substrate.

In a second aspect, an embodiment of the present disclosure provides a display device, which includes a display backplane and a color filter substrate that are aligned and combined into a cell, where the color filter substrate is the color filter substrate of the first aspect.

In a third aspect, an embodiment of the present disclosure provides a method for manufacturing a color filter substrate, including:
  forming a black matrix on a base substrate;

forming a color filter layer on the base substrate, where the color filter layer is located in a gap formed by the black matrix;

forming a barrier layer on a side of the black matrix away from the base substrate;

forming a first inorganic layer on a side of the color filter layer away from the base substrate, where the first inorganic layer completely covers the barrier layer;

forming a quantum dot layer on a side of the first inorganic layer away from the base substrate, where the quantum dot layer is located in a gap formed by the barrier layer and is arranged corresponding to the color filter layer.

In some implementations, the method further includes:

forming a second inorganic layer on the base substrate before forming the color filter layer on the base substrate, where the second inorganic layer completely covers the black matrix;

the forming the color filter layer on the base substrate includes:

forming the color filter layer on a side of the second inorganic layer away from the base substrate.

In some implementations, the method further includes:

forming a third inorganic layer on a side of the quantum dot layer away from the base substrate, where the third inorganic layer covers the second inorganic layer;

forming a plurality of pillar supports arranged at intervals on a side of the third inorganic layer away from the base substrate, where a cross section of the pillar support in a direction perpendicular to the base substrate is a trapezoid, and a short base of the trapezoid is closer to the barrier layer than a long base of the trapezoid;

forming a metal reflective layer on an outer surface of the pillar support, where the metal reflective layer is configured to reflect light incident from a light incident side to the quantum dot layer.

In some implementations, the method further includes:

forming a fourth inorganic layer on the outer surface of the pillar support before forming the metal reflective layer on the outer surface of the pillar support, the forming of the metal reflective layer on the outer surface of the pillar support includes:

forming the metal reflective layer on an outer surface of the fourth inorganic layer, where the metal reflective layer exposes a surface of the fourth inorganic layer away from the base substrate.

DESCRIPTION OF EMBODIMENTS

The present disclosure is described in detail below and some embodiments of the present disclosure are illustrated in the accompanying drawings, in which like reference signs refer to the same or similar elements or elements with the same or similar functionality throughout. In addition, if a detailed description of known art is unnecessary for illustrating features of the present disclosure, it is omitted. The embodiments described below with reference to the accompanying drawings are exemplary only for explaining the present disclosure and are not construed as limiting the present disclosure.

It will be understood by those of ordinary skill in the art that, unless otherwise defined, all terms (including technical terms and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As one of ordinary skill in the art will appreciate, the singular forms "a", "an" and "the" as used herein may include the plural forms as well, unless expressly stated otherwise. It will be understood that when an element is referred to as being "connected" or "coupled" to another element, it can be directly connected or coupled to the other element or intervening elements may be present. Further, "connected" or "coupled" as used herein may include wirelessly connected or wirelessly coupled. As used herein, the term "and/or" includes all, any one, or any combination of one or more of the associated listed items.

In an existing procedure of manufacturing QD-OLED devices, there are many technical problems, for example, in a procedure of aligning and combining a color filter substrate and a display backplane into a cell, high-precision alignment is difficult to be achieved, a color cross phenomenon is easily occurred, and the final display effect is affected.

The technical solutions of the present disclosure are described in detail with specific embodiments in the following with reference to the accompanying drawings.

Figure 1:
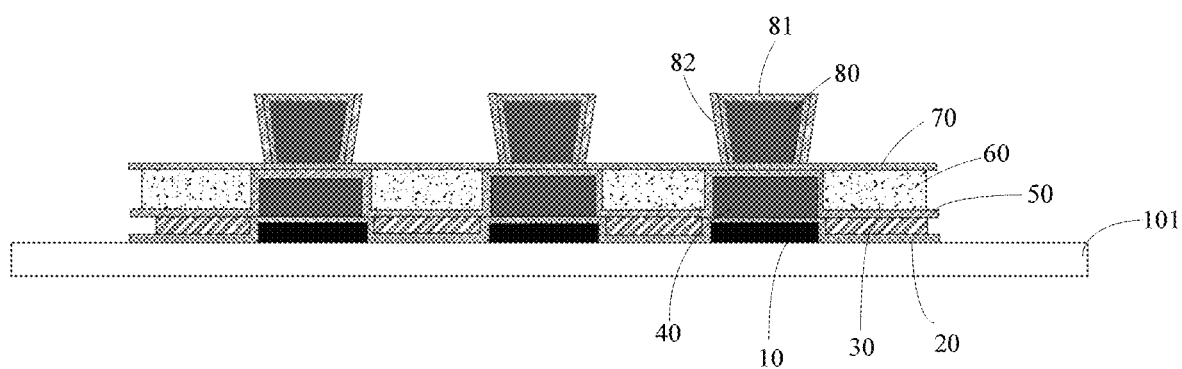
FIG. 1 is a schematic cross-sectional structure diagram of a color filter substrate according to an embodiment of the present disclosure.

FIG. 1 is a schematic structure diagram of a color filter substrate according to an embodiment of the present disclosure. The color filter substrate may be aligned and combined with a display backplane to form a display device, and includes, for example, a quantum dot light emitting diode (QD-LED), a quantum dot organic light emitting diode (QD-OLED), or the like. The display backplane usually can emit blue light with high energy to excite the quantum dot layer 60 in the color filter substrate to emit light, and light emitted from the quantum dot layer 60 passes through the color filter layer 30 to form color light, so that the display device can display colors. In the related art, there are still many technical problems in the procedure of manufacturing the color filter substrate, and an important technical problem is: when the color filter substrate is manufactured, the color filter substrate is mainly made of organic materials, and a plurality of organic material layers are stacked together, so that an integral internal stress of the color filter substrate is relative large, the color filter substrate is easy to bend and deform, high-precision alignment is difficult to be achieved in the procedure of aligning and combining the color filter substrate with the display backplane, a color cross phenomenon is occurred, and the final display effect is affected.

In order to solve the technical problem that high-precision alignment is difficult to be achieved in the procedure of aligning and combining the color filter substrate with the display backplane, and a color cross phenomenon is occurred, as shown in FIG. 1, an embodiment of the present disclosure provides a color filter substrate, and the color filter substrate may include a base substrate 101, a black matrix 10 and a color filter layer 30 that are located on the base substrate 101, a quantum dot layer 60 that is located on a side of the color filter layer 30 away from the base substrate 101, and a barrier layer 40 that is located on a side of the black matrix 10 away from the base substrate 101, the color filter substrate further includes a first inorganic layer 50, and the first inorganic layer 50 at least includes: a first portion located between the color filter layer 30 and the quantum dot layer 60; a second portion located between the quantum dot layer 60 and the barrier layer 40; and a third portion on a side of the barrier layer 40 away from the base substrate 101.

In practical applications, the color filter layer 30 may include a blue filter layer (CF-B layer) for displaying blue light, a green filter layer (CF-G layer) for displaying green light, and a red filter layer (CF-R layer) for displaying red light, and each color filter layer 30 is usually made of an organic material. The black matrix (BM) 10 is generally located between two adjacent color filter layers 30 for two colors, and is used to isolate the two color filter layers 30, so as to prevent color lights emitted by the two adjacent color filter layers 30 from interfering with each other, color cross, and the like, and for convenience of processing and cost reduction, the black matrix 10 is also generally made of an organic material. The quantum dot (QD) layer 60 is generally a film layer formed of an organic material added with a quantum dot material, performs light conversion by the quantum dot material, and can be disposed corresponding to the color filter layer 30 and on the color filter layer 30, since different QD materials emit light within different wave bands after being excited by an excitation light source, for example, a blue light quantum dot (QD-B) layer, a red light quantum dot (QD-R) layer and a green light quantum dot (QD-G) layer can emit blue light, red light and green light respectively when they are excited by a blue light source, quantum dot layers 60 of different materials may be disposed corresponding to different color filter layers 30, for example, the QD-B layer is disposed on the CF-B layer, the QD-G layer is disposed on the CF-G layer, and the QD-R layer is disposed on the CF-R layer. The barrier layer 40 may also include a plurality of sub-layers disposed at intervals, each sub-layer may be located between two adjacent quantum dot layers 60 for two colors, so as to isolate and define positions of the quantum dot layers 60, the barrier layer 40 and the quantum dot layer 60 each generally have a certain thickness (a dimension in a direction perpendicular to the base substrate 101, being greater than that of the black matrix 10 and the color filter layer 30), and the barrier layer 40 is also generally made of an organic material for the convenience of processing and cost reduction.

The thickness of the black matrix 10 may be slightly greater than that of the color filter layer 30 so as to effectively define the position of the color filter layer 30; similarly, the thickness of the barrier layer 40 may be slightly greater than that of the quantum dot layer 60, so as to effectively define the position of the quantum dot layer 60, and prevent light of different colors from interfering with each other, color cross, and the like. Specifically, the thickness of the black matrix 10 may range from about 1 µm to about 12 µm (micrometers), for example, may be about 3.5 µm; the thickness of the color filter layer 30 may range from about 1 µm to about 12 µm, for example, may be about 3 µm; the thickness of the quantum dot layer 60 may range from about 2 µm to about 16 µm, for example, may be about 10 µm; the thickness of the barrier layer 40 may range from about 2 µm to about 15 µm, for example, may be about 10.5 µm.

The color filter substrate provided by the embodiment of the present disclosure includes the color filter layer 30, the black matrix 10, the quantum dot layer 60, the barrier layer 40 and the first inorganic layer 50 on the base substrate 101, and the first inorganic layer 50 at least includes the first portion between the color filter layer 30 and the quantum dot layer 60, the second portion between the quantum dot layer 60 and the barrier layer 40, and the third portion on the side of the barrier layer 40 away from the base substrate 101, and by providing the first inorganic layer 50, the color filter layer 30 is separated from the quantum dot layer 60, the quantum dot layer 60 is separated from the barrier layer 40, and when the color filter layer 30, the quantum dot layer 60 and the barrier layer 40 are organic layers, the first inorganic layer 50 is located between the organic layers, and since internal stress directions of the organic layer and the inorganic layer are opposite to each other, and can be offset to each other, the first inorganic layer 50 can reduce internal stress of the color filter substrate, which is generated due to more and thicker organic layers, can effectively reduce a bending degree of the color filter substrate, thereby an accuracy of alignment of the color filter substrate and the display backplane is ensured, and a color cross phenomenon is avoided. Moreover, the first portion of the first inorganic layer 50 is located between the color filter layer 30 and the quantum dot layer 60, and thus has a certain light adjusting effect on the light emitted by the quantum dot layer 60, so that the light emitted by the color filter substrate is softer.

In some implementations, the color filter substrate according to the embodiment of the present disclosure may further include a second inorganic layer 20, and the second inorganic layer 20 may include: a fourth portion located on the base substrate 101 and located on a side of the color filter layer 30 proximal to the base substrate 101; a fifth portion that is located on the base substrate 101 and is located between the color filter layer 30 and the black matrix 10; a sixth portion between the black matrix 10 and the barrier layer 40. On the basis of the first inorganic layer 50, the second inorganic layer 20 is added, and the second inorganic layer 20 operates similar to the first inorganic layer 50, so that the internal stress of the color filter substrate can be offset, the bending degree of the color filter substrate can be further reduced, the accuracy of alignment of the color filter substrate and the display backplane can be further improved, and the color cross phenomenon can be avoided.

In some implementations, the color filter substrate according to the embodiment of the present disclosure may further include a plurality of pillar supports 80, the pillar supports 80 are disposed at intervals on a side of the barrier layer 40 away from the base substrate 101, and the pillar supports 80 are disposed to support the organic layers of the color filter substrate, so as to further reduce the bending degree of the color filter substrate (may achieve no bending), so as to ensure that, when the color filter substrate is aligned and combined with the display backplane, the QD layer is not extruded to deform, thereby further improving the accuracy of alignment of the color filter substrate and the display backplane.

Further, a cross section of the pillar support 80 in a direction perpendicular to the base substrate 101 may be a trapezoid, and a short base of the trapezoid is closer to the barrier layer 40 than a long base of the trapezoid, i.e., the trapezoid may be an inverted trapezoid. A metal reflective layer 82 may be disposed on an outer surface of the inverted trapezoid pillar support 80, and the metal reflective layer 82 can reflect light (which may be blue light emitted from the display backplane) incident from a light incident side to the quantum dot layer 60, so that more light reaches the quantum dot layer 60, thereby improving light utilization efficiency of the excitation light source. Meanwhile, light emitted from a certain light emitting layer can be prevented from reaching the adjacent quantum dot layer 60, and thus the color cross phenomenon can be further eliminated. Further, the metal reflective layer 82 may be disposed only on a sidewall of the pillar support 80, so as to prevent light from being reflected on a surface of the pillar support 80 away from the base substrate 101, prevent light propagation from being blocked, and prevent a color cross phenomenon from occurring.

The pillar support 80 being formed in the shape of inverted trapezoid facilitates the formation of the metal reflective layer 82. The pillar support 80 may be made of an organic material, and may be specifically made of epoxy resin, acrylate, silica gel, or the like. A height of the trapezoid may be in a range of about 2 μm to about 20 μm, and an acute included angle of the trapezoid may range from about 30 degrees to about 90 degrees, so that the following reflection effect of the metal reflective layer 82 can be achieved. The height of the trapezoid may be about 8 μm, for example; the acute included angle of the trapezoid may be, for example, 70 degrees, so as to improve a conformal coverage of the outer reflective metal layer. The material of the metal reflective layer 82 may include aluminum or silver, for example, may include aluminum with high reflectivity and low cost, and the thickness of the aluminum or silver may range from about 50 nm to about 8000 nm, for example, may be about 2000 nm.

In some implementations, the color filter substrate according to the embodiment of the present disclosure may further include a third inorganic layer 70, and the third inorganic layer 70 may be located between the barrier layer 40 and the pillar support 80 and cover the quantum dot layer 60, so that when the metal reflective layer on the surface of the pillar support 80 is fabricated, the quantum dot layer 60 and the barrier layer 40 are prevented from being contaminated and corroded, and the quantum dot layer 60 is protected.

In some implementations, the color filter substrate according to the embodiment of the present disclosure may further include a fourth inorganic layer 81, and the fourth inorganic layer 81 may be disposed between the pillar support 80 and the metal reflective layer 82, and is configured to protect the pillar support 80 and prevent the pillar support 80 from being contaminated and corroded in the process of depositing and etching the metal reflective layer.

Specifically, a thickness of each of the first inorganic layer 50, the second inorganic layer 20, the third inorganic layer 70, and the fourth inorganic layer 81 may range from about 100 nm to about 1500 nm, the thickness of the first inorganic layer 50 is greater than the thickness of the second inorganic layer 20, and the thickness of the second inorganic layer 20 is greater than the thickness of the third inorganic layer 70. Since the first inorganic layer 50 is located between the color filter layer 30 and the quantum dot layer 60 and between the quantum dot layer 60 and the barrier layer 40, a contact area between the first inorganic layer 50 and the organic layers of the color filter substrate is relatively large, and the first inorganic layer has a great effect of counteracting the internal stress of the color filter substrate and reducing the bending degree of the color filter substrate, the thickness of the first inorganic layer 50 may be greater than the thickness of the second inorganic layer 20 and the thickness of the third inorganic layer 70, so as to ensure that the first inorganic layer can effectively counteract the internal stress of the color filter substrate and reduce the bending degree of the color filter substrate. The second inorganic layer 20 supplements the effect of the first inorganic layer 50, so that the bending degree of the color filter substrate can be further reduced, and the thickness of the second inorganic layer 20 may be smaller than that of the first inorganic layer 50. The third inorganic layer 70 mainly serves to protect the quantum dot layer 60, so it can be relatively thin.

Furthermore, a material of each of the first inorganic layer 50, the second inorganic layer 20, the third inorganic layer 70, and the fourth inorganic layer 81 may include one or more of silicon nitride (SiNx), silicon oxide ($SiO_2$), silicon oxynitride (SiON) and aluminum oxide ($Al_2O_3$), and may be a single layer or multiple layers (with different materials), these inorganic materials are transparent materials, and refractive indexes of these inorganic materials are similar to those of the organic material layers of the color filter substrate, which is favorable for light propagation.

In some implementations, the material of the first inorganic layer 50 may be SiON, and the thickness of the first inorganic layer 50 may be about 800 nm; the material of the second inorganic layer 20 may be $SiO_2$, and the thickness of the second inorganic layer 20 may be about 500 nm; the material of the third inorganic layer 70 may be SiNx, and the thickness of the third inorganic layer 70 may be about 200 nm. The refractive index of SiNx is about 1.84, the refractive index of SiON is about 1.75, the refractive index of $SiO_2$ is about 1.50, and the refractive indexes of the organic layers are about 1.49 to about 1.52, so that, along the propagation direction of light, the refractive indexes of the layers are set from high to low, which is more favorable for light to be emitted from the base substrate 101, and the utilization rate of the light source can be improved. The material of the fourth inorganic layer 81 may also be SiNx with high refractive index, and the thickness of the fourth inorganic layer 81 may be about 300 nm.

It should be noted that the specific materials and thicknesses of the inorganic layers are only an implementation of the embodiment of the present disclosure, and the present disclosure is not limited thereto, as long as the respective functions of the inorganic layers can be achieved.

Figure 2:
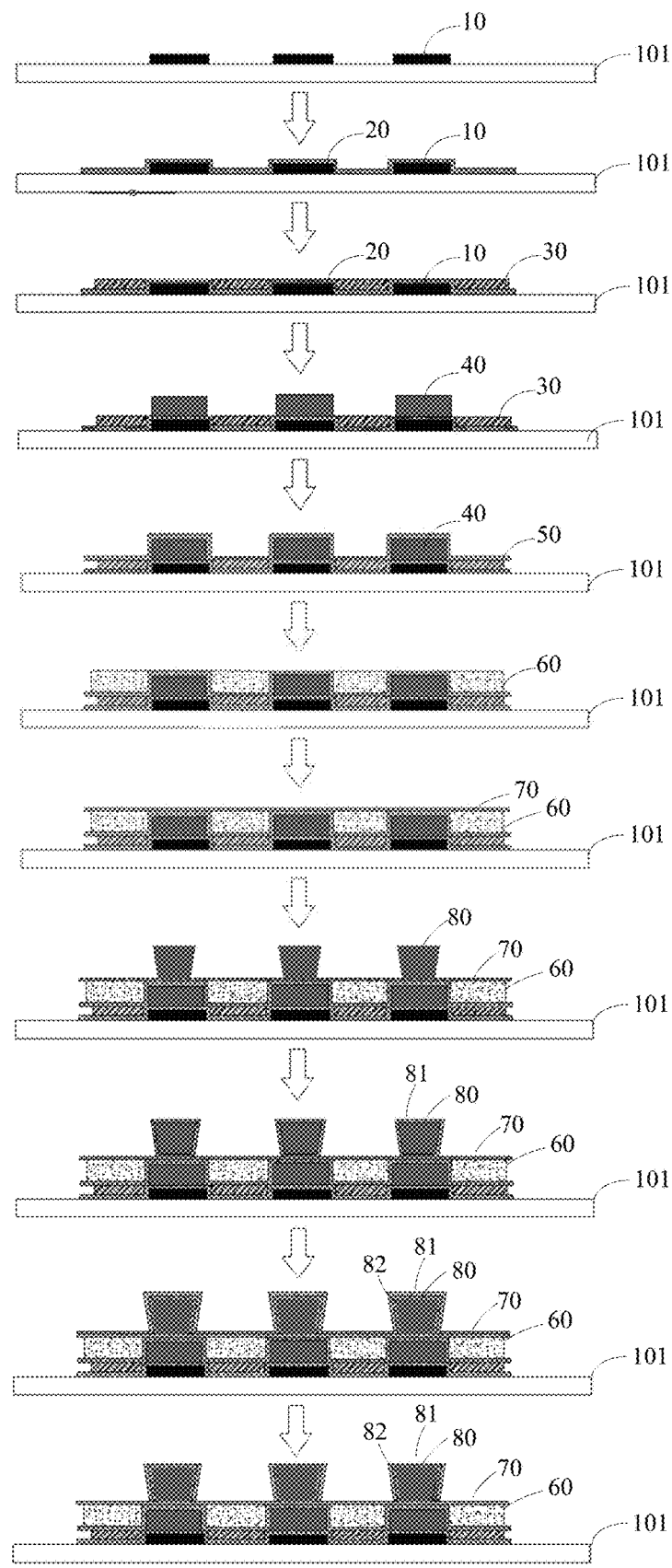
FIG. 2 is a schematic flowchart of a procedure of manufacturing a color filter substrate according to an embodiment of the present disclosure.

In some implementations, as shown in FIG. 2, a specific process for manufacturing the color filter substrate according to the embodiment of the present disclosure may include the following steps S1 to S11.

S1, forming the black matrix 10 on the base substrate 101 to define the position of the color filter layer 30.

S2, forming the second inorganic layer 20 on the base substrate 101, so that the second inorganic layer 20 completely covers the black matrix 10, and has a thickness of about 500 nm, so as to separate the black matrix 10 from the color filter layer 30.

S3, forming the color filter layer 30 in the gap formed by the black matrix 10 and on the second inorganic layer 20 so that the color filter layer 30 has a thickness of about 3.0 μm, and includes CF-B, CF-G and CF-R.

S4, depositing the barrier layer 40 over the black matrix 10 so that the barrier layer 40 has a thickness of about 0.5 μm and defines the position of the quantum dot layer 60.

S5, depositing the first inorganic layer 50 over the color filter layer 30 so that the first inorganic layer 50 completely covers the barrier layer 40, and has a thickness of about 800 nm, so as to separate the barrier layer 40 from the quantum dot layer 60 (to be deposited in next step).

S6, depositing the quantum dot layer 60 over the first inorganic layer 50 so that the quantum dot layer 60 has a thickness of about 10 µm, and is provided with QD-B, QD-G and QD-R corresponding to CF-B, CF-G and CF-R, respectively.

S7, depositing the third inorganic layer 70 over the quantum dot layer 60 and the barrier layer 40 so that the third inorganic layer 70 has a thickness of about 200 nm, and at least completely covers the quantum dot layer 60 to protect the quantum dot layer 60.

S8, manufacturing the pillar support 80 in a shape of inverted trapezoid so that the height of the inverted trapezoid is about 8 µm, and the included angle between the long base and a leg of the inverted trapezoid is about 70 degrees. Specifically, an entire layer of organic material having a thickness corresponding to the height (the dimension in the direction perpendicular to the base substrate 101) of the pillar support 80 may be formed on the third inorganic layer 70 first, and then the entire layer may be patterned by exposure and development to obtain the pillar support 80 in the shape of inverted trapezoid. The included angle between the long base and the leg of the inverted trapezoid can be controlled by controlling the exposure amount (the greater the exposure amount is, the smaller the included angle between the long base and the leg of the inverted trapezoid is).

S9, depositing the fourth inorganic layer 81 on the outer surface of the pillar support 80 so that the fourth inorganic layer 81 has a thickness of about 300 nm, so as to prevent metal ions at a high temperature from sputtering to the organic pillar support 80 to cause the material of the pillar support 80 to splash and contaminate the chamber when the metal reflective layer 82 is formed outside the pillar support 80. Specifically, a plasma enhanced chemical vapor deposition (PECVD) process may be employed to first deposit an inorganic layer on the third inorganic layer 70, and the inorganic layer may have a thickness greater than the height of the pillar support 80; then, the inorganic layer is patterned to obtain the fourth inorganic layer 81 on the outer surface of the pillar support 80.

S10, forming an entire metal reflective layer over the third inorganic layer 70 so that the entire metal reflective layer covers an outer surface of the fourth inorganic layer 81. Specifically, the entire metal reflective layer may be formed by adopting an evaporation or magnetron sputtering process, and may be an Al film layer with a thickness of about 2000 nm.

S11, patterning the entire metal reflective layer, to remove a portion of the entire metal reflective layer on a surface of the pillar support 80 away from the base substrate 101 and a portion of the entire metal reflective layer on a surface of the third inorganic layer 70, so as to form the metal reflective layer 82 covering only the side surface of the pillar support 80.

Figure 4:
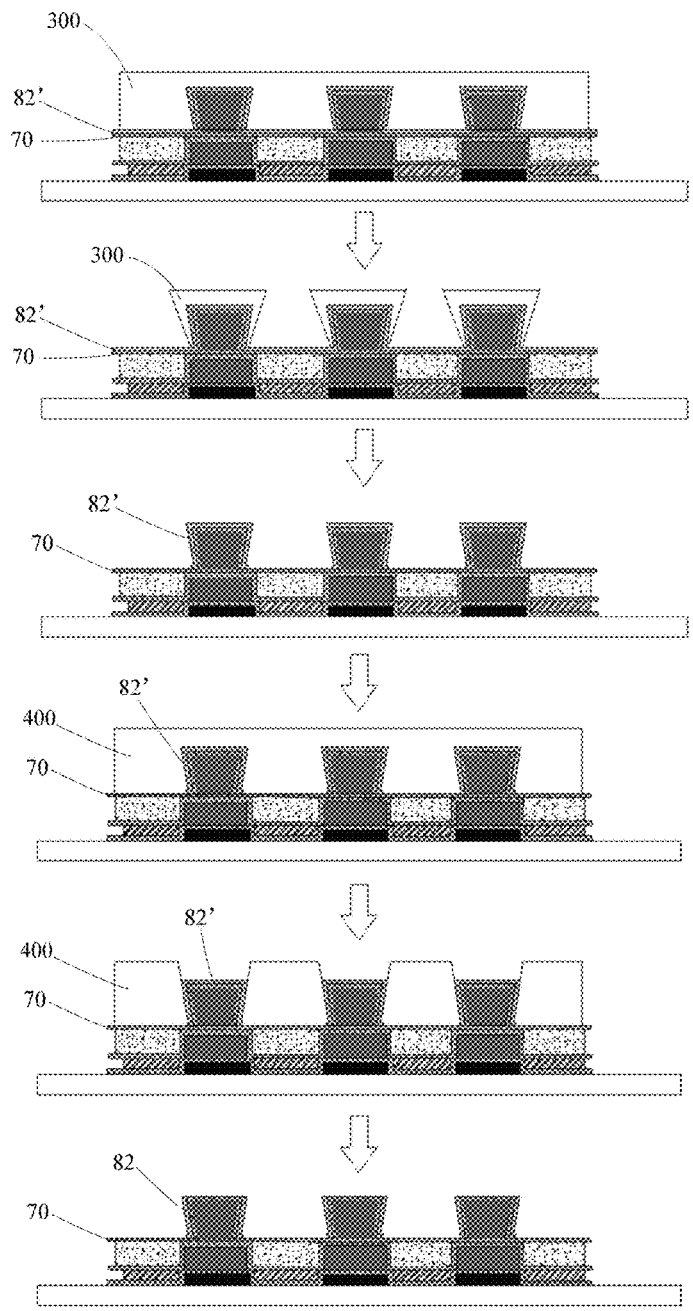
FIG. 4 is a schematic flowchart of a procedure of removing an A1 film layer on a surface of a pillar support away from a base substrate by using a photoresist.
Figure 5:
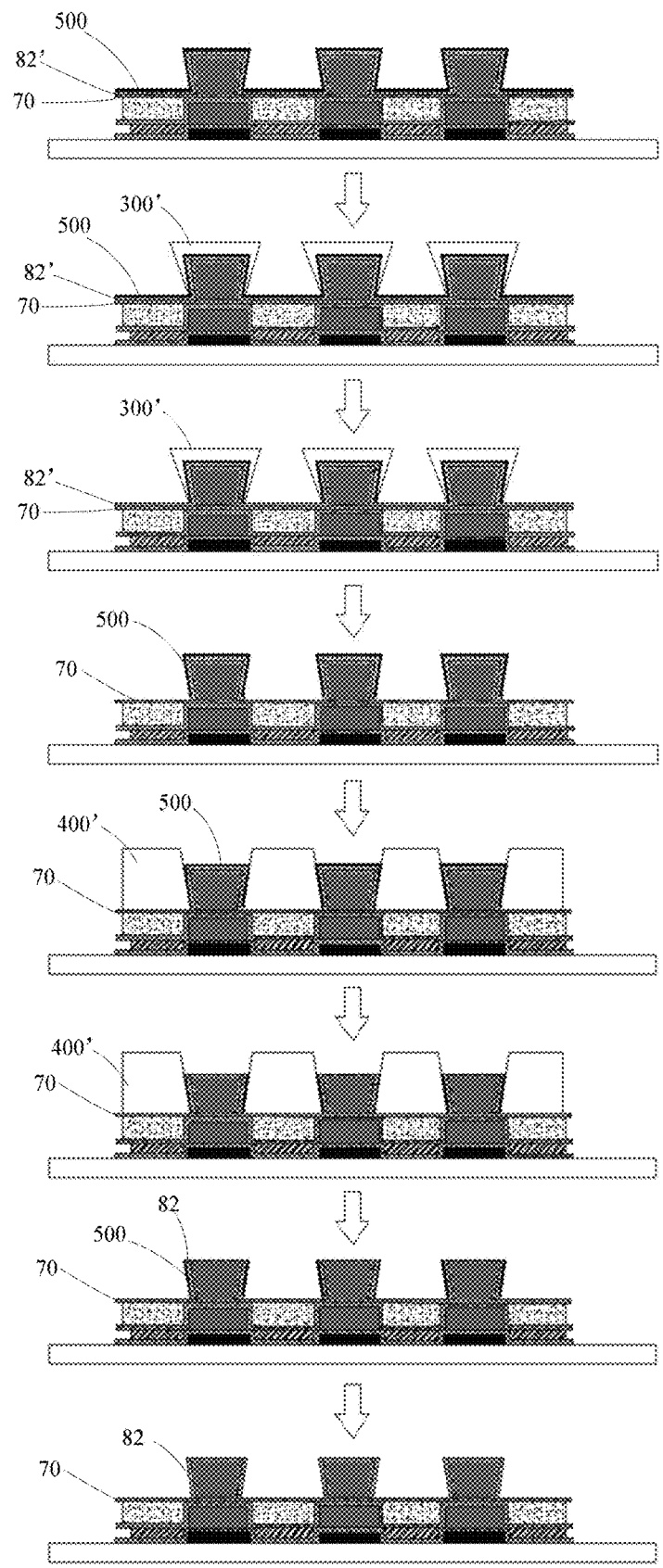
FIG. 5 is a schematic flowchart of a procedure of removing an A1 film layer on a surface of the pillar support from a base substrate by using a photoresist and a hard mask.

The above formation of the metal reflective layer 82 covering only the side surface of the pillar support 80 can be achieved by at least two processes, a first one of which is achieved by using a negative photoresist and a positive photoresist, and a second one of which is achieved by using a hard mask, a negative photoresist and a positive photoresist. In the first process, as shown in FIG. 4, a negative photoresist 300 is coated on the entire metal reflective layer 82', and after exposure and development using a suitable photoresist mask, a portion of the negative photoresist 300 directly above the third inorganic layer 70 is removed to expose the portion of the entire metal reflective layer 82' above the third inorganic layer 70, and then the portion of the entire metal reflective layer 82' above the third inorganic layer 70 (a small amount of metal reflective layer may remain at a position close to the pillar support 80 due to protection of the negative photoresist 300 at the side surface of the pillar support 80) and the remaining negative photoresist 300 are removed by etching, stripping, and the like, and then a positive photoresist 400 is coated on the entire third inorganic layer 70, and after exposure and development using a suitable photoresist mask, the positive photoresist 400 on a surface of the pillar support 80 away from the base substrate 101 is removed, the surface of the entire metal reflective layer 82' on the surface of the pillar support 80 away from the base substrate 101 is exposed, and then the metal reflective layer 82 covering only the side surface of the pillar support 80 can be obtained by removing the portion of the entire metal reflective layer 82' on the surface of the pillar support 80 away from the base substrate 101 and the remaining positive photoresist 400 through etching, stripping, or the like. In the second process, as shown in FIG. 5, a hard mask layer 500 is formed on the entire metal reflective layer 82' through a deposition process, and then a negative photoresist 300' is entirely coated on the hard mask layer 500, and after exposure and development using a suitable photoresist mask, a portion of the hard mask layer 500 directly above the third inorganic layer 70 may be exposed, and then the exposed portion of the hard mask layer 500 directly above the third inorganic layer 70 may be removed through etching, stripping, and the like, so as to expose a portion of the entire metal reflective layer 82' directly above the third inorganic layer 70, and then the exposed portion of the entire metal reflective layer 82' directly above the third inorganic layer 70 and the remaining negative photoresist 300' may be removed through an etching process, and then a positive photoresist 400' is entirely coated on the third inorganic layer 70, and after exposure and development using a suitable photoresist mask, a portion of the positive photoresist 400' on the surface of the pillar support 80 away from the base substrate 101 may be removed to expose the portion of the hard mask layer 500 on the surface of the pillar support 80 away from the base substrate 101, and then the portion of the hard mask layer 500 on the surface of the pillar support 80 away from the base substrate 101, the portion of the entire metal reflective layer 82' on the surface of the pillar support 80 away from the base substrate 101, and the remaining positive photoresist 400' are sequentially removed by etching, stripping, and the like, and then the remaining portion of the hard mask layer 500 (the portion on the side surface of the pillar support 80) is etched away to obtain the metal reflective layer 82 covering the side surface of the pillar support 80. If the refractive index of the hard mask layer 500 is similar to that of the metal reflective layer 82, the hard mask layer 500 also has a light reflection function, and the portion of the hard mask layer 500 on the side surface of the pillar support 80 may be remained (i.e., the last step in FIG. 5 may be omitted).

Figure 3:
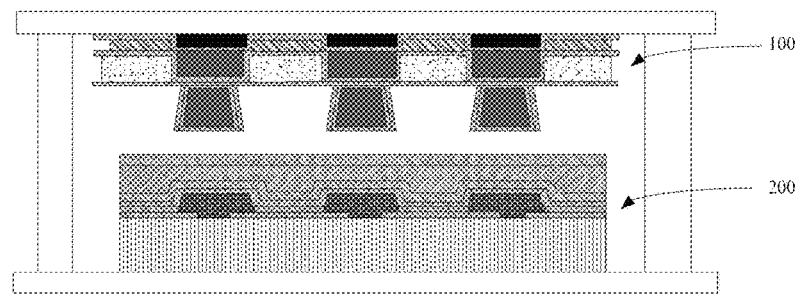
FIG. 3 is a schematic cross-sectional structure diagram of a display device according to an embodiment of the present disclosure.

Based on the same concept of the color filter substrate, as shown in FIG. 3, an embodiment of the present disclosure further provides a display device, which includes a display backplane 200 and a color filter substrate 100 that are aligned and combined into a cell, where the color filter substrate 100 is the color filter substrate of the foregoing embodiment.

The display device provided by the embodiment of the present disclosure may include the color filter substrate of the forgoing embodiment, and thus at least the beneficial effects of the color filter substrate can be achieved, and the details are not repeated herein.

One of ordinary skill in the art will appreciate that various steps, measures or schemes in various operations, methods or flows that have been discussed in the present application may be substituted, altered, rearranged, decomposed, combined, or eliminated.

In the description of the present application, it is to be understood that terms indicating orientation or positional relationship, such as "on", "over", "outer", etc., indicate orientation or positional relationship based on that shown in the drawings, merely for convenience in describing the present disclosure and simplifying the description, and do not indicate or imply that the device or element referred to must have a particular orientation, be constructed in a particular orientation, and be operated in a particular orientation, and therefore, should not be taken as limiting the present disclosure.

The foregoing is only a few embodiments of the present application, and it should be noted that, various modifications and adaptations can be made by those skilled in the art without departing from the principle of the present application and should be considered as falling within the scope of the present application.

The invention claimed is:

1. A color filter substrate, comprising a base substrate, a black matrix and a color filter layer which are located on the base substrate, a quantum dot layer which is located on a side of the color filter layer away from the base substrate, and a barrier layer which is located on a side of the black matrix away from the base substrate, wherein the black matrix defines a position of the color filter layer, the barrier layer defines a position of the quantum dot layer, the color filter substrate further comprises a first inorganic layer, and the first inorganic layer at least comprises:
   a first portion located between the color filter layer and the quantum dot layer;
   a second portion located between the quantum dot layer and the barrier layer; and
   a third portion on a side of the barrier layer away from the base substrate the color filter substrate further comprises:
   a second inorganic layer, wherein the second inorganic layer comprises:
   a fourth portion located on a side of the color filter layer proximal to the base substrate;
   a fifth portion located between the color filter layer and the black matrix; and
   a sixth portion located between the black matrix and the barrier layer, the color filter substrate further comprises:
   a plurality of pillar supports, wherein the plurality of pillar supports are spaced apart on a side of the barrier layer away from the base substrate.

2. The color filter substrate according to claim 1, wherein a cross section of the pillar support in a direction perpendicular to the base substrate is a trapezoid, and a short base of the trapezoid is closer to the barrier layer than a long base of the trapezoid;
   the color filter substrate further comprises a metal reflective layer, and the metal reflective layer is located on an outer surface of the pillar support and configured to reflect light incident from a light incident side to the quantum dot layer.

3. The color filter substrate according to claim 1, further comprising a third inorganic layer, wherein the third inorganic layer is located between the barrier layer and the pillar support, covers the quantum dot layer, and is configured to protect the quantum dot layer.

4. The color filter substrate according to claim 3, wherein a thickness of each of the first inorganic layer, the second inorganic layer and the third inorganic layer ranges from about 100 nm to about 1500 nm, the thickness of the first inorganic layer is greater than that of the second inorganic layer, and the thickness of the second inorganic layer is greater than that of the third inorganic layer.

5. The color filter substrate according to claim 3, wherein a material of each of the first inorganic layer, the second inorganic layer and the third inorganic layer comprises one or more of silicon nitride, silicon dioxide, silicon oxynitride and aluminum oxide.

6. The color filter substrate according to claim 3, wherein a refractive index of the material of the third inorganic layer is greater than a refractive index of the material of the first inorganic layer, and the refractive index of the material of the first inorganic layer is greater than a refractive index of the material of the second inorganic layer.

7. The color filter substrate according to claim 2, further comprising a fourth inorganic layer, wherein the fourth inorganic layer is located between the pillar support and the metal reflective layer, and is configured to protect the pillar support.

8. The color filter substrate according to claim 7, wherein a thickness of each of the first inorganic layer, the second inorganic layer and the fourth inorganic layer ranges from about 100 nm to about 1500 nm, the thickness of the first inorganic layer is greater than that of the second inorganic layer, and the thickness of the second inorganic layer is greater than that of the fourth inorganic layer.

9. The color filter substrate according to claim 7, wherein a material of each of the first inorganic layer, the second inorganic layer, and the fourth inorganic layer comprises one or more of silicon nitride, silicon dioxide, silicon oxynitride, and aluminum oxide.

10. The color filter substrate according to claim 7, wherein a refractive index of the material of the fourth inorganic layer is greater than a refractive index of the material of the first inorganic layer, and the refractive index of the material of the first inorganic layer is greater than a refractive index of the material of the second inorganic layer.

11. The color filter substrate according to claim 2, wherein the metal reflective layer is made of aluminum or silver, and a thickness of the metal reflective layer ranges from about 50 nm to about 8000 nm.

12. The color filter substrate according to claim 2, wherein the metal reflective layer does not cover a surface of the pillar support away from the base substrate.

13. A display device, comprising a display backplane and a color filter substrate which are aligned and combined into a cell, wherein the color filter substrate is the color filter substrate according to claim 1.

14. A method for manufacturing a color filter substrate, comprising:
   forming a black matrix on a base substrate;
   forming a color filter layer on the base substrate so that the color filter layer is located in a gap formed by the black matrix;
   forming a barrier layer on a side of the black matrix away from the base substrate;
   forming a first inorganic layer on a side of the color filter layer away from the base substrate so that the first inorganic layer completely covers the barrier layer; and
   forming a quantum dot layer on a side of the first inorganic layer away from the base substrate so that the quantum dot layer is located in a gap formed by the barrier layer and is arranged corresponding to the color filter layer, the method further comprises:

forming a second inorganic layer on the base substrate before forming the color filter layer on the base substrate so that the second inorganic layer completely covers the black matrix; and the forming the color filter layer on the base substrate comprises:

forming the color filter layer on a side of the second inorganic layer away from the base substrate, the method further comprises:

forming a third inorganic layer on a side of the quantum dot layer away from the base substrate so that the third inorganic layer covers the second inorganic layer;

forming a plurality of pillar supports arranged at intervals on a side of the third inorganic layer away from the base substrate, wherein a cross section of each pillar support in a direction perpendicular to the base substrate is a trapezoid, and a short base of the trapezoid is closer to the barrier layer than a long base of the trapezoid;

forming a metal reflective layer on an outer surface of the pillar support, wherein the metal reflective layer is configured to reflect light incident from a light incident side to the quantum dot layer.

15. The method according to claim 14, further comprising:

forming a fourth inorganic layer on the outer surface of the pillar support before forming the metal reflective layer on the outer surface of the pillar support; and the forming the metal reflective layer on the outer surface of the pillar support comprises:

forming the metal reflective layer on an outer surface of the fourth inorganic layer so that the metal reflective layer exposes a surface of the fourth inorganic layer away from the base substrate.

* * * * *